US006999020B2

(12) United States Patent
Mizumasa et al.

(10) Patent No.: US 6,999,020 B2
(45) Date of Patent: Feb. 14, 2006

(54) SEMICONDUCTOR INTEGRATED CIRCUIT (75) Inventors: Tatsuhiro Mizumasa, Kawasaki (JP);
Atsushi Hitaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/855,738

(22) Filed: May 28, 2004

(65) Prior Publication Data
US 2005/0162301 A1 Jul. 28, 2005

(30) Foreign Application Priority Data
Jan. 27, 2004 (JP) .............................. 2004-018776

(51) Int. Cl.
*H03M 1/34* (2006.01)
(52) U.S. Cl. ...................... 341/162; 341/155; 341/118; 331/14; 331/17; 345/211; 375/376
(58) Field of Classification Search ................ 341/121, 341/155, 118, 110, 139, 162; 375/376; 331/14, 331/17; 345/211, 213
See application file for complete search history.

(56) References Cited

U.S. PATENT DOCUMENTS

| 4,291,332 | A | * | 9/1981 | Kato et al. ................... 375/376 |
| 5,835,544 | A | * | 11/1998 | Yoshimura et al. ......... 375/376 |
| 6,201,535 | B1 | * | 3/2001 | Hwang ........................ 345/213 |
| 6,472,888 | B2 | * | 10/2002 | Oguma et al. ............... 324/691 |
| 6,501,411 | B2 | * | 12/2002 | Soundarapandian et al. ........................... 341/161 |
| 6,512,470 | B2 | * | 1/2003 | Fwu ............................ 341/118 |
| 6,686,860 | B2 | * | 2/2004 | Gulati et al. ................. 341/155 |
| 6,798,185 | B2 | * | 9/2004 | Tanghe et al. ............... 341/121 |
| 2002/0105451 | A1 | | 8/2002 | Gulati et al. |
| 2002/0167433 | A1 | | 10/2002 | Karthikeyan et al. |

FOREIGN PATENT DOCUMENTS

JP    2000-201076    7/2000

OTHER PUBLICATIONS

Gu-Yeon Wei, et al., "A Fully Digital, Energy-Efficient, Adaptive Power-Supply Regulator", IEEE Journal of Solid-State Circuits, IEEE Inc., New York, vol. 34, No. 4, Apr. 1999, pp. 520-528.

\* cited by examiner

*Primary Examiner*—Lam T. Mai
(74) *Attorney, Agent, or Firm*—Arent Fox PLLC (57) ABSTRACT A frequency detecting circuit 10 detects frequency of a sampling pulse SP, and outputs the detected frequency as a detection value VOUT. A current adjusting circuit 20 adjusts a power supply current Ivd to be supplied to an AD converter 30 in accordance with the detection value VOUT. The power supply current Ivd varies continuously so as to follow the sampling frequency. As a result, an optimum power supply current Ivd can always be supplied in accordance with the operating frequency of the AD converter 30. That is, power consumption of the AD converter 30 can be reduced. Since the power supply current Ivd can be adjusted in accordance with the sampling frequency, it is possible to form the AD converter 30 that has a wide frequency band and allows great versatility.

8 Claims, 6 Drawing Sheets

Fig. 6

SEMICONDUCTOR INTEGRATED CIRCUIT

CROSS-REFERENCE TO RELATED APPLICATIONS

This application is based upon and claims the benefit of priority from the prior Japanese Patent Application No. 2004-018776, filed on Jan. 27, 2004, the entire contents of which are incorporated herein by reference.

BACKGROUND OF THE INVENTION

1. Field of the Invention

The present invention relates to a semiconductor integrated circuit having an AD converter or a DA converter, and more particularly to a method for reducing power consumption.

2. Description of the Related Art

AD converters convert an analog signal into a plurality of bits of digital signal in synchronization with sampling pulses. Similarly, DA converters convert a plurality of bits of digital signal into an analog signal in synchronization with sampling pulses. The operating speeds of the AD converters and DA converters depend on the frequencies of the sampling pulses (sampling frequencies). The higher the sampling frequencies are, the higher the power consumptions are. Thus, the AD converters and DA converters are so designed that they are supplied with sufficient power supply currents at maximum sampling frequencies. In general, currents that flow steadily through the AD converters and DA converters are independent of the sampling frequencies. This means the consumption of power supply currents higher than necessary even when the sampling frequencies are low.

In order to optimize the power consumption of an AD converter, there have been proposed methods for adjusting the power supply current of the AD converter stepwise by means of control signals which indicate the operation mode (for example, Japanese Unexamined Patent Application Publication No. 2000-201076).

SUMMARY OF THE INVENTION

According to a first aspect of the present invention, an AD converter converts an analog signal received in synchronization with a sampling pulse into a digital signal. A frequency detecting circuit detects frequency of the sampling pulse, and outputs the detected frequency as a detection value. A current adjusting circuit adjusts a power supply current to be supplied to the AD converter in accordance with the detection value. For example, the power supply current to be supplied to the AD converter is increased when the frequency of the sampling pulse is high, and decreased when the frequency of the sampling pulse is low. The power supply current varies continuously so as to follow the sampling frequency.

The power supply current flowing steadily through the AD converter (current not contributing to the operation of AD conversion) decreases with a decrease in the sampling frequency. As a result, an optimum power supply current can always be supplied in accordance with the operating frequency of the AD converter. This means a reduction in power consumption. Since the power supply current can be adjusted in accordance with the sampling frequency, it is possible to form an AD converter that has a wide frequency band. In particular, an AD converter allowing great versatility can be formed since it is possible to adjust the power supply current automatically without receiving control signals from exterior.

According to a preferred example of the foregoing first aspect, the AD converter has an operational circuit and a plurality of cascaded AD conversion units. Each of the AD conversion units has a holding unit, a sub AD converter, a sub DA converter, a subtracter, and a multiplier. The holding unit receives and holds an analog value output from the AD conversion unit at the preceding stage or an analog signal from the exterior of the AD converter in synchronization with the sampling pulse. The sub AD converter converts the analog value or the analog signal held by the holding unit into k bits of digital value. The sub DA converter converts the k-bit digital value converted by the sub AD converter into an analog value. The subtracter obtains a difference between the analog value or the analog signal held by the holding unit and the analog value converted by the sub DA converter, and outputs the obtained difference as an analog value. The multiplier multiplies the analog value output from the subtracter by $2^k$, and supplies the multiplied value to the holding unit at the next stage. Then, the AD conversion units sequentially generate respective k bits different from each other out of a plurality of bits of digital signal.

The operational circuit synthesizes the k-bit digital values generated sequentially into the plurality of bits of digital signal. As above, according to the present invention, a so-called pipelined AD converter is formed. The current adjusting circuit adjusts a plurality of types of bias voltages for adjusting power supply currents to be supplied to the multipliers of the AD conversion units, respectively, in accordance with the detection value. Consequently, in the pipelined AD converter, the power supply currents of the multipliers can be adjusted in accordance with the sampling frequency, allowing a reduction in power consumption of the AD converter.

According to a preferred example of the foregoing first aspect, the current adjusting circuit has a bias generating unit for generating the bias voltages. The current adjusting circuit also has a transistor arranged between a power supply line and a power supply terminal of the bias generating unit. The frequency detecting circuit outputs the detection value as a detection voltage to the gate of the transistor. The bias voltages can thus be changed continuously in accordance with the gate voltage corresponding to the sampling frequency, so that they can always be set at optimum values. As a result, the power supply currents of the multipliers can be adjusted optimally in accordance with the sampling frequency, allowing a reduction in power consumption.

According to a second aspect of the present invention, a DA converter converts a digital signal received in synchronization with a sampling pulse into an analog signal. A frequency detecting circuit detects frequency of the sampling pulse, and outputs the detected frequency as a detection value. A current adjusting circuit adjusts a power supply current to be supplied to the DA converter in accordance with the detection value. For example, the power supply current to be supplied to the DA converter is increased when the frequency of the sampling pulse is high, and decreased when the frequency of the sampling pulse is low. The power supply current varies continuously so as to follow the sampling frequency.

The power supply current flowing steadily through the DA converter (current not contributing to the operation of DA conversion) decreases with a decrease in the sampling frequency. As a result, an optimum power supply current can always be supplied in accordance with the operating frequency of the DA converter. This means a reduction in power consumption. Since the power supply current can be adjusted in accordance with the sampling frequency, it is possible to form a DA converter that has a wide frequency band. In particular, a DA converter allowing great versatility can be formed since it is possible to adjust the power supply current automatically without receiving control signals from exterior.

According to a preferred example of the foregoing first and second aspects, the current adjusting circuit has a transistor arranged between a power supply terminal of the AD converter and a power supply line. The frequency detecting circuit outputs the detection value as a detection voltage to the gate of the transistor. The power supply currents can thus be changed continuously in accordance with the gate voltage corresponding to the sampling frequency, so that they can always be set at optimum values.

According to a preferred example of the foregoing first and second aspects, the frequency detecting circuit has a pulse generating circuit, a timer circuit, and a smoothing circuit. The pulse generating circuit generates an edge detection pulse in synchronization with either one of a rising edge and a falling edge of the sampling pulse. The timer circuit starts to measure predetermined time in synchronization with the edge detection pulse, and outputs a rectangular pulse which maintains a low level during measuring and maintains a high level during non-measuring. The smoothing circuit smoothes a voltage of the rectangular pulse, and outputs the smoothed voltage as the detection voltage. The foregoing circuit configuration facilitates generation of the detection voltage which varies continuously in accordance with the frequency of the sampling pulse.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

The present invention has been achieved to solve the following problems. When the power supply current is adjusted by means of control signals, the power supply current can be adjusted in $2^n$ possible patterns, where "n" is the number of control signals. To establish optimum settings of the power supply current for sampling frequencies, the control signals must therefore be increased in number. This complicates the adjusting circuit of the power supply current. Moreover, since the control signals are generated by the system for controlling the AD converter, the settings of the power supply current are not necessarily optimum for the AD converter which is in actual operation. Such problems also occur with a DA converter.

The present invention has been achieved to solve the foregoing problems. It is thus an object of the present invention to supply an AD converter with an optimum power supply current in accordance with the sampling frequency of the AD converter. Another object is to supply a DA converter with an optimum power supply current in accordance with the sampling frequency of the DA converter.

Hereinafter, embodiments of the present invention will be described with reference to the drawings. Signals supplied through the external terminals are designated by the same reference symbols as the names of the terminals. Signal lines for transmitting signals are designated by the same reference symbols as the names of the signals.

Figure 1:
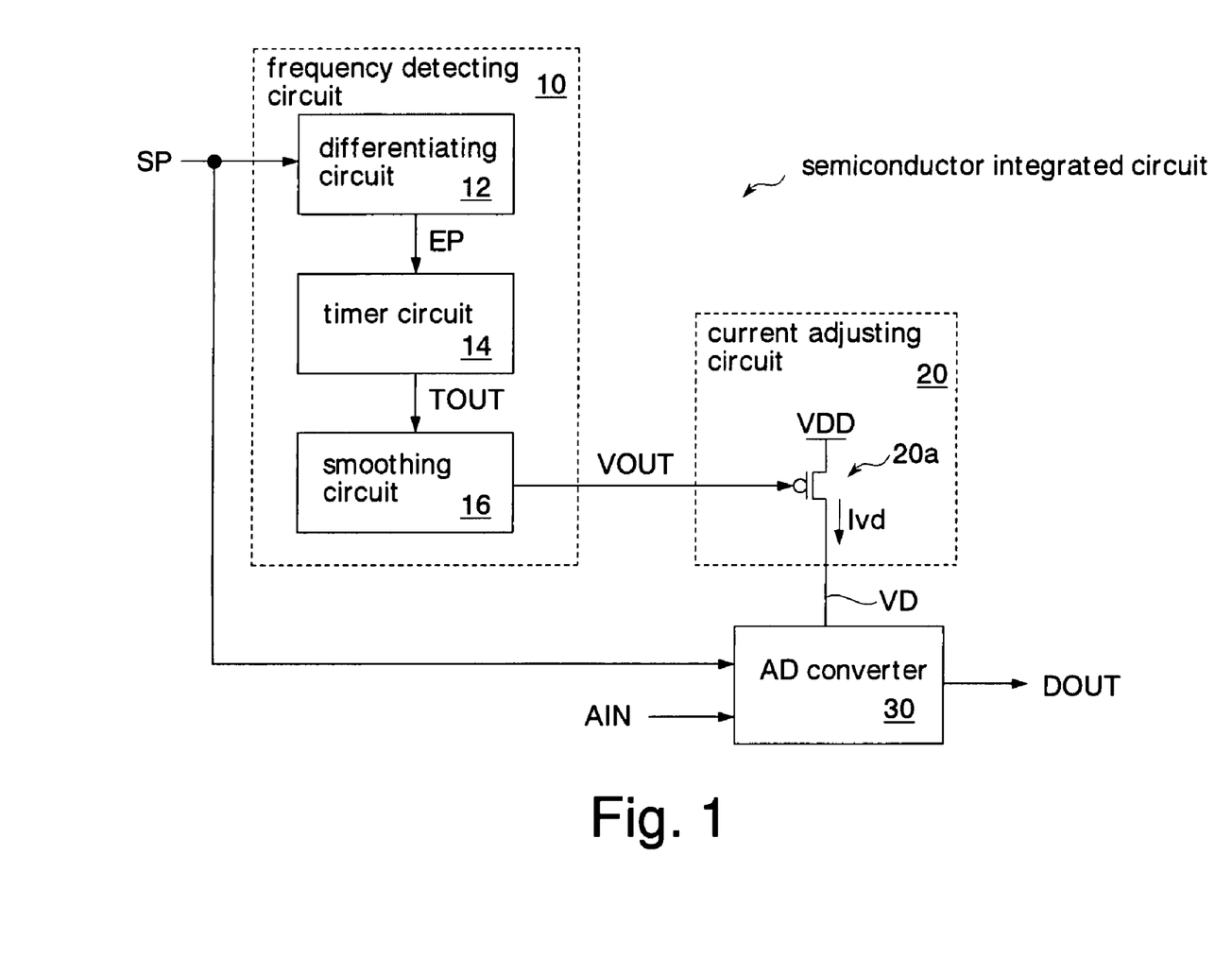
FIG. 1 is a block diagram showing a first embodiment of the semiconductor integrated circuit of the present invention.

FIG. 1 shows a first embodiment of the semiconductor integrated circuit of the present invention. This semiconductor integrated circuit is formed on a silicon substrate by using CMOS processes, as a system LSI to be mounted on a hand-held terminal such as a cellular phone. The semiconductor integrated circuit has a frequency detecting circuit 10, a current adjusting circuit 20, and an AD converter 30. Aside from the components shown in the diagram, the semiconductor integrated circuit also contains a CPU core, an internal memory, a DA converter, a DSP, a timer, etc. The frequency detecting circuit 10 has a differentiating circuit 12 (pulse generating circuit), a timer circuit 14, and a smoothing circuit 16.

The frequency detecting circuit 10 receives a sampling pulse SP which determines the operating frequency of the AD converter 30, and outputs a detection voltage VOUT which indicates the frequency of the sampling pulse SP, or sampling frequency. The frequency detecting circuit 10 will be detailed in conjunction with FIG. 2. The current adjusting circuit 20 has a pMOS transistor 20a whose source and drain are connected to a power supply line VDD and a power supply terminal VD of the AD converter 30, respectively. The gate of the pMOS transistor 20a receives the detection voltage VOUT from the frequency detecting circuit 10. The AD converter 30 receives an analog signal AIN in synchronization with the sampling pulse SP, and converts the received analog signal AIN into a digital signal DOUT for output.

Figure 2:
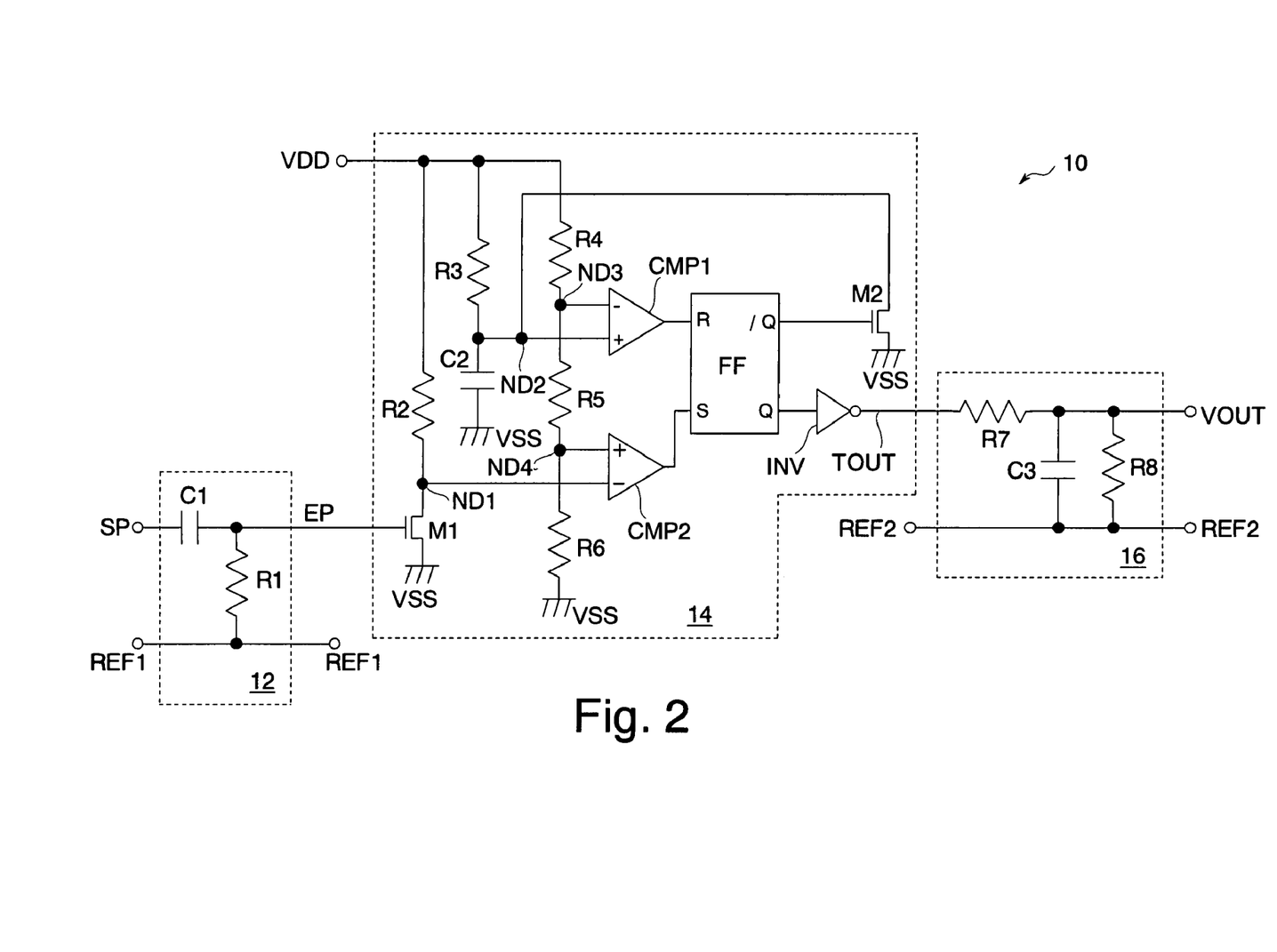
FIG. 2 is a circuit diagram showing the details of a frequency detecting circuit shown in FIG. 1.

FIG. 2 shows the details of the frequency detecting circuit 10 shown in FIG. 1. The differentiating circuit 12 has a capacitor C1 which is arranged between the input node of the sampling pulse SP and the output node of an edge detection pulse EP, and a resistor R1 which is arranged between the output node EP and a reference voltage line REF1 (for example, ground line). The differentiating circuit 12 generates the edge detection pulse EP (differentiation signal) which is in synchronization with the transition edges of the sampling pulse SP.

The timer circuit 14 has: comparators CMP1 and CMP2 which are made of differential amplifiers; an RS flip-flop FF which receives the outputs of the comparators CMP1 and CMP2 at its reset terminal R and set terminal S, respectively; an nMOS transistor M2 whose gate is connected to the /Q output of the RS flip-flop FF; an inverter INV which is connected to the Q output of the RS flip-flop FF; and a resistor R2 and an nMOS transistor M1, a resistor R3 and a capacitor C2, and resistors R4, R5, and R6 which are connected in respective series between the power supply line VDD and the ground line VSS.

The "− input" and "+ input" of the comparator CMP1 are connected to the connection node ND3 between the resistors R4 and R5 and the connection node ND2 between the resistor R3 and the capacitor C2, respectively. The "+ input" and "− input" of the comparator CMP2 are connected to the connection node ND4 between the resistors R5 and R6 and the connection node ND1 between the resistor R2 and the nMOS transistor M1, respectively. The nMOS transistor M2 is connected to the ground line VSS at its source, and connected to the node ND2 at its drain. The inverter INV outputs a timer output signal TOUT to the smoothing circuit 16.

The timer circuit 14 operates in the following manner. When the comparator CMP2 receives a positive pulse out of edge detection pulses EP generated by the differentiating circuit 12, it outputs a high level to set the flip-flop FF. When the comparator CMP2 receives an edge detection pulse EP of low level, it outputs a low level. When the flip-flop FF is reset (/Q=high level), the node ND2 drains the electric charge off the capacitor C2, thereby changing to a low level. When the flip-flop FF is set (/Q=low level), the node ND2 charges the capacitor C2, gradually changing to a high level. Consequently, the flip-flop FF is reset after a predetermined time corresponding to the capacitance of the capacitor C2 since it is set.

The timer circuit 14 inverts the Q output of the flip-flop FF through the inverter INV, and outputs the resultant as the timer output signal TOUT. The timer circuit 14 thus starts to measure the predetermined time in synchronization with a positive pulse of the edge detection pulse EP (the rising edge of the sampling pulse SP), keeps the timer output signal TOUT at the low level during measuring, and keeps the timer output signal TOUT at the high level during non-measuring (after measuring). Then, for the timer output signal TOUT, the timer circuit 14 outputs a rectangular pulse which has a shorter high level period when the frequency of the sampling pulse SP is high, and has a longer high level period when the frequency of the sampling pulse SP is low. Incidentally, the measuring of the timer circuit 14 may be started in synchronization with the falling edge of the sampling pulse SP.

The smoothing circuit 16 has: a resistor R7 which is arranged between the input node of the timer output signal TOUT and the output node of the detection voltage VOUT; and a capacitor C3 and a resistor R8 which are arranged in parallel between the output node VOUT and a reference voltage line REF2 (for example, ground line). The smoothing circuit 16 smoothes (averages) the voltage of the timer output signal TOUT output from the timer circuit 14, and outputs the resultant as the detection voltage VOUT. The detection voltage VOUT decreases with an increase in the frequency of the sampling pulse SP, and increases with a decrease in the frequency of the sampling pulse SP. The foregoing circuit configuration facilitates generating the detection voltage VOUT which varies continuously in accordance with the frequency of the sampling pulse SP.

Figure 3:
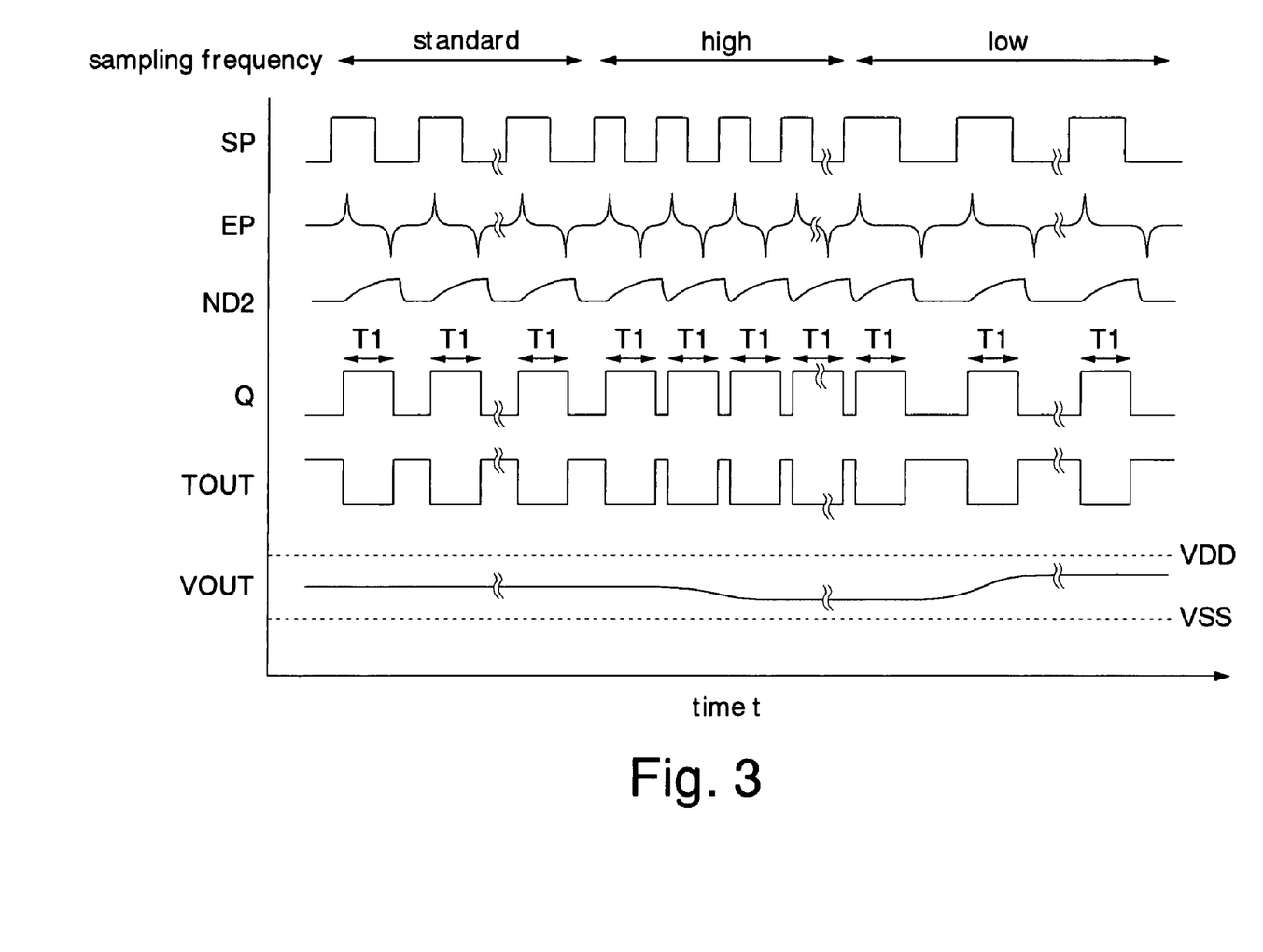
FIG. 3 is a waveform chart showing the operation of the frequency detecting circuit shown in FIG. 2.

FIG. 3 shows the operation of the frequency detecting circuit 10 shown in FIG. 2. In the diagram, the high level periods T1 of the Q output of the flip-flop FF indicate when the timer circuit 14 is measuring. The low level periods of the Q output indicate when the timer circuit 14 is not measuring. The periods T1 are constant, irrespective of the frequency of the sampling pulse SP. On the other hand, the non-measuring periods of the timer circuit 14, i.e., the high level periods of the timer output signal TOUT (the low level periods of the Q output) become shorter when the frequency of the sampling pulse SP is high, and become longer when the frequency of the sampling pulse SP is low. Consequently, the detection voltage VOUT, which is the smoothed voltage of the timer output signal TOUT, falls when the frequency of the sampling pulse SP is high, and rises when the frequency of the sampling pulse SP is low. The detection voltage VOUT is supplied to the gate of the pMOS transistor 20a of the current adjusting circuit 20 shown in FIG. 1. The power supply current Ivd supplied to the AD converter 30 thus increases when the power consumption is high, or the frequency of the sampling pulse SP is high, and decreases when the power consumption is low, or the frequency of the sampling pulse SP is low. The power supply current Ivd varies continuously in accordance with the frequency of the sampling pulse SP. As a result, an optimum power supply current Ivd can always be supplied in accordance with the operating frequency of the AD converter 30.

As above, according to the present embodiment, the power supply current Ivd to be supplied to the AD converter 30 can be changed continuously so as to follow the sampling frequency. As a result, an optimum power supply current Ivd can always be supplied in accordance with the operating frequency of the AD converter 30, thereby allowing a reduction in power consumption. Since the power supply current Ivd can be adjusted in accordance with the sampling frequency, it is possible to form an AD converter 30 that has a wide frequency band. In particular, the AD converter 30 allowing great versatility can be formed because it is possible to adjust the power supply current Ivd in accordance with the sampling frequency automatically without receiving control signals from exterior.

Since the AD converter 30 having a wide frequency band can be formed, it is possible, for example, to achieve both the AD conversion function of GSM (Global System for Mobile communications) system and the AD conversion function of W-CDMA (Wideband Code Division Multiple Access) system by the single AD converter. In other words, with a semiconductor integrated circuit to be mounted on a cellular phone having a dual-mode function capable of calls of GSM system and W-CDMA system, it is possible to reduce the number of AD converters formed on the semiconductor integrated circuit. As a result, the semiconductor integrated circuit can be reduced in chip size and chip cost.

Since the AD converter 30 allowing great versatility can be formed, it is possible to meet various requirements specification. It is therefore possible to reduce the frequency of redesigning the AD converter due to unsatisfied requirement specification. This can prevent losing business chances and allow reduction in design resources.

The detection voltage VOUT is supplied to the gate of the pMOS transistor 20a which is arranged between the power supply line VDD and the power supply terminal VD of the AD converter 30. This makes it possible to change the power supply current Ivd continuously in accordance with the gate voltage which corresponds to the sampling frequency. The frequency detecting circuit 10, composed of the differentiating circuit 12, the timer circuit 14, and the smoothing circuit 16, facilitates generating the detection voltage VOUT that varies continuously in accordance with the frequency of the sampling pulse SP.

Figure 4:
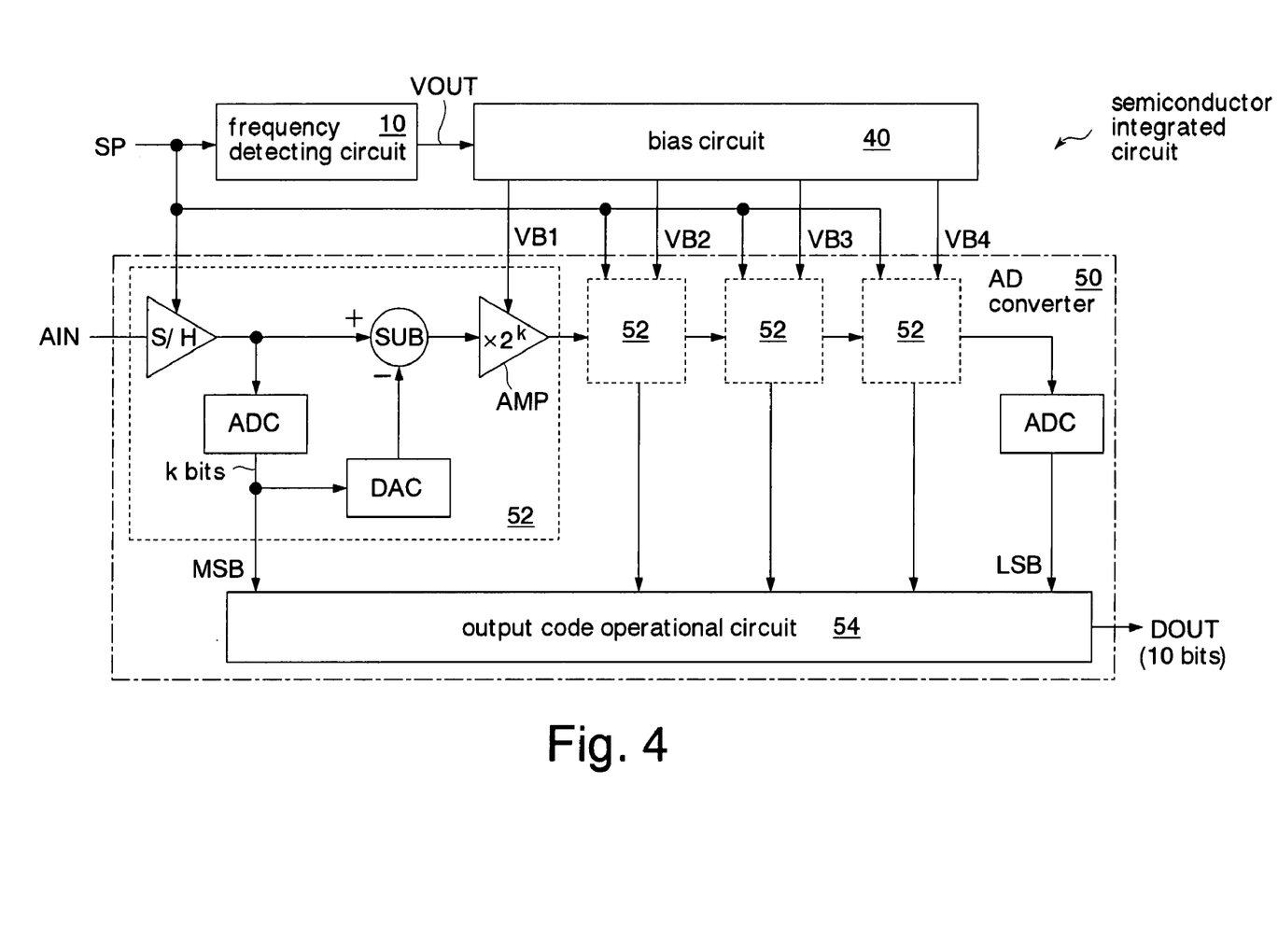
FIG. 4 is a block diagram showing a second embodiment of the semiconductor integrated circuit of the present invention.

FIG. 4 shows a second embodiment of the semiconductor integrated circuit of the present invention. The same elements as those described in the first embodiment will be designated by identical reference numbers or symbols. Detailed description thereof will be omitted. Like the first embodiment, this semiconductor integrated circuit is formed on a silicon substrate by using CMOS processes, as a system LSI to be mounted on a hand-held terminal such as a cellular phone. Aside from the components shown in the diagram, the semiconductor integrated circuit also contains a CPU core, an internal memory, a DA converter, a DSP, a timer, etc. The semiconductor integrated circuit has a frequency detecting circuit 10, a bias circuit (current adjusting circuit) 40, and an AD converter 50.

The bias circuit 40 receives the detection voltage VOUT from the frequency detecting circuit 10, and generates bias voltages VB1 to VB4 in accordance with the detection voltage VOUT. The bias voltages VB1 to VB4 are supplied to the amplifiers AMP (multipliers) of four AD conversion units 52 in the AD converter 50 for the sake of adjusting the power supply currents of the amplifiers AMP.

The AD converter 50 has the four, cascaded AD conversion units 52, a sub AD converter ADC for receiving the output of the AD conversion unit 52 at the final stage, and an output code operational circuit 54. Each of the AD conversion units 52 has a holding unit S/H, a sub AD converter ADC, a sub DA converter DAC, a subtracter SUB, and a differential amplifier AMP. This AD converter 50 is typically referred to as of pipelined system. This type of AD converter converts an analog signal into descending-order bits of digital value sequentially by using a plurality of sampling periods. The AD conversion units 52 thus convert respective analog signals different from each other into digital values at an identical time. The output code operational circuit 54 synthesizes digital values generated at different times to generate a digital signal DOUT corresponding to an input analog signal. That is, the AD converter 50 receives an analog signal AIN in synchronization with a sampling pulse SP, and converts the received analog signal AIN into a 10-bit digital signal DOUT for output.

The holding unit S/H of the AD conversion unit 52 at the initial stage receives and holds the analog signal AIN supplied from exterior of the AD converter 50 in synchronization with the sampling pulse SP. The holding units S/H of the AD conversion units 52 at the second to fourth stages receive and hold the analog values output from the AD conversion units 52 at the respective preceding stages in synchronization with the sampling pulse SP. The sub AD converters ADC convert the analog signal or analog values held by the holding units S/H into k bits of digital values. In this embodiment, "k" is "2". The two-bit digital values are output to the output code operational circuit 54.

The sub DA converters DAC convert the two-bit digital values converted by the sub AD converters ADC into analog values. The subtracters SUB obtain the differences between the analog signal or analog values held by the holding units S/H and the analog values converted by the sub DA converters DAC, and output the obtained differences as analog values. The amplifiers AMP multiply the analog values output from the subtracters SUB by $2^k$ (in this example, "4"), and supply the multiplied values to the holding units S/H at the next stages. Then, the AD conversion units 52 generate respective k bits different from each other (two bits) sequentially. The sub AD converter ADC that receives an analog value from the AD conversion unit 52 at the final stage converts this analog value into k bits (two bits) of digital value. The converted digital value is output to the output code operational circuit 54. Here, the digital values output from the AD conversion units 52 at earlier stages correspond to higher-order bits, and those at later stages correspond to lower-order bits. The output code operational circuit 54 synthesizes the two-bit digital values generated at different times successively to generate a 10-bit digital signal.

Figure 5:
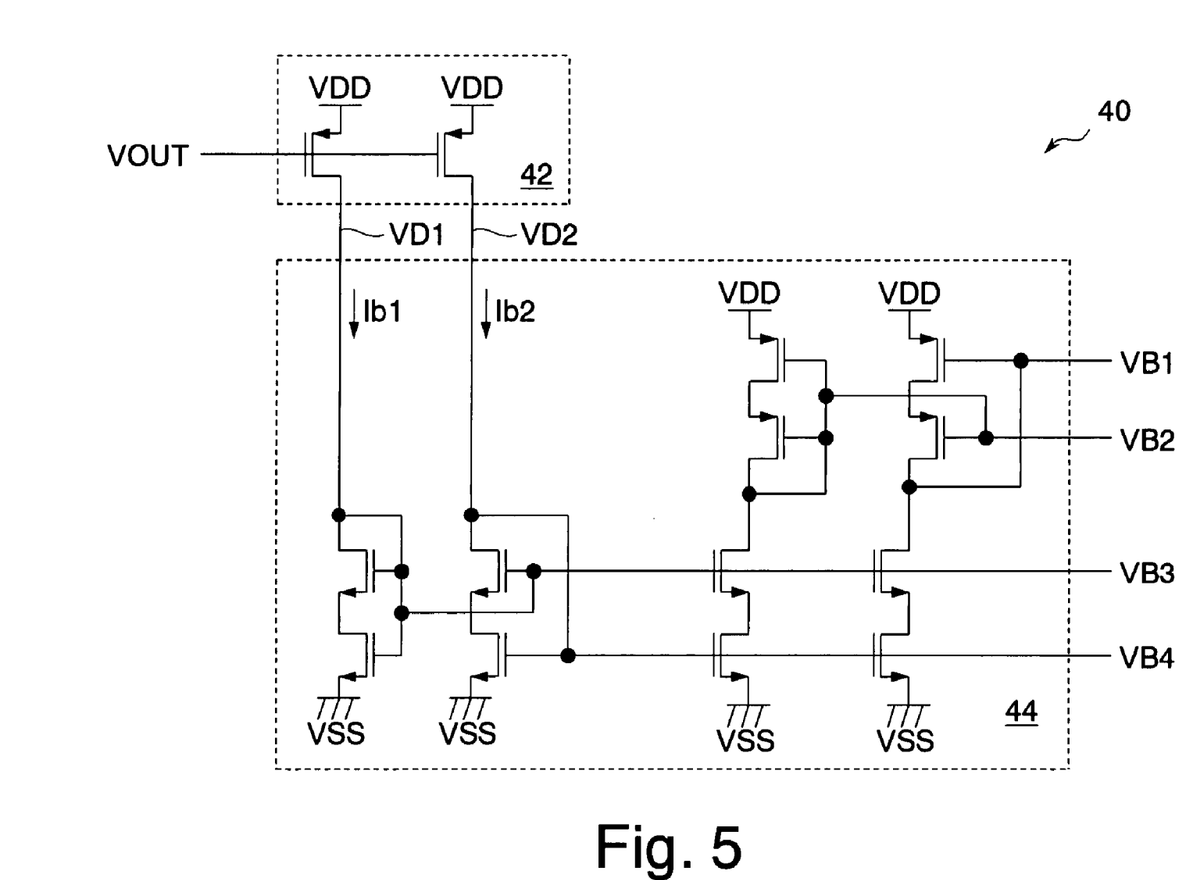
FIG. 5 is a circuit diagram showing the details of a bias circuit shown in FIG. 4.

FIG. 5 shows the details of the bias circuit 40 in FIG. 4. The bias circuit 40 has a current adjusting circuit 42 and a bias generating unit 44. The current adjusting circuit 42 has pMOS transistors 44a and 44b whose sources and drains are connected to a power supply line VDD and the power supply terminals VD1, VD2 of the bias generating unit 44, respectively. The gates of the pMOS transistors 44a and 44b receive the detection voltage VOUT. The bias generating unit 44 has a plurality of pMOS transistors and nMOS transistors, and generates predetermined bias voltages VB1 to VB4 which are different from each other. In the diagram, the pMOS transistors are represented by transistors having arrows directed to their gates. The nMOS transistors are represented by transistors having arrows directed away from their gates.

When the detection voltage VOUT changes with the frequency of the sampling pulse SP, bias currents Ib1 and Ib2 supplied to the bias generating unit 44 vary continuously, and the bias voltages VB1 to VB4 vary continuously. The variations of the bias voltages VB1 to VB4 change the power supply currents to be supplied to the amplifiers AMP shown in FIG. 4. With the changes of the power supply currents, the amplifiers AMP vary in driving capability and in power consumption. More specifically, when the sampling pulse SP increases in frequency, the bias voltages VB1 to VB4 shift to increase the power consumptions of the amplifiers AMP. The amplifiers AMP thus increase in driving capability with an increase in amplifying speed. On the other hand, when the sampling pulse SP decreases in frequency, the bias voltages VB1 to VB4 shift to decrease the power consumptions of the amplifiers AMP. The amplifiers AMP thus decrease in driving capability with a drop in amplifying speed. In the pipelined AD converter, it is the differential amplifier operating as multiplier that is the highest in power consumption. Thus, when the frequency of the sampling pulse SP is low, the power consumptions of the amplifiers AMP can be decreased to reduce the power consumption of the AD converter 50.

This embodiment can provide the same effects as those of the first embodiment described above. Moreover, in this embodiment, the pipelined AD converter 50 can adjust the power supply currents of the amplifiers AMP in the plurality of AD conversion units 52 in accordance with the frequency of the sampling pulse SP. This allows a reduction in the power consumption of the AD converter 50. The bias voltages VB1 to VB4 can be changed continuously in accordance with the gate voltage (detection voltage VOUT) corresponding to the sampling frequency, so that they can always be set at optimum values. As a result, the power supply currents of the amplifiers AMP can be adjusted in accordance with the sampling frequency optimally, allowing a reduction in power consumption.

Figure 6:
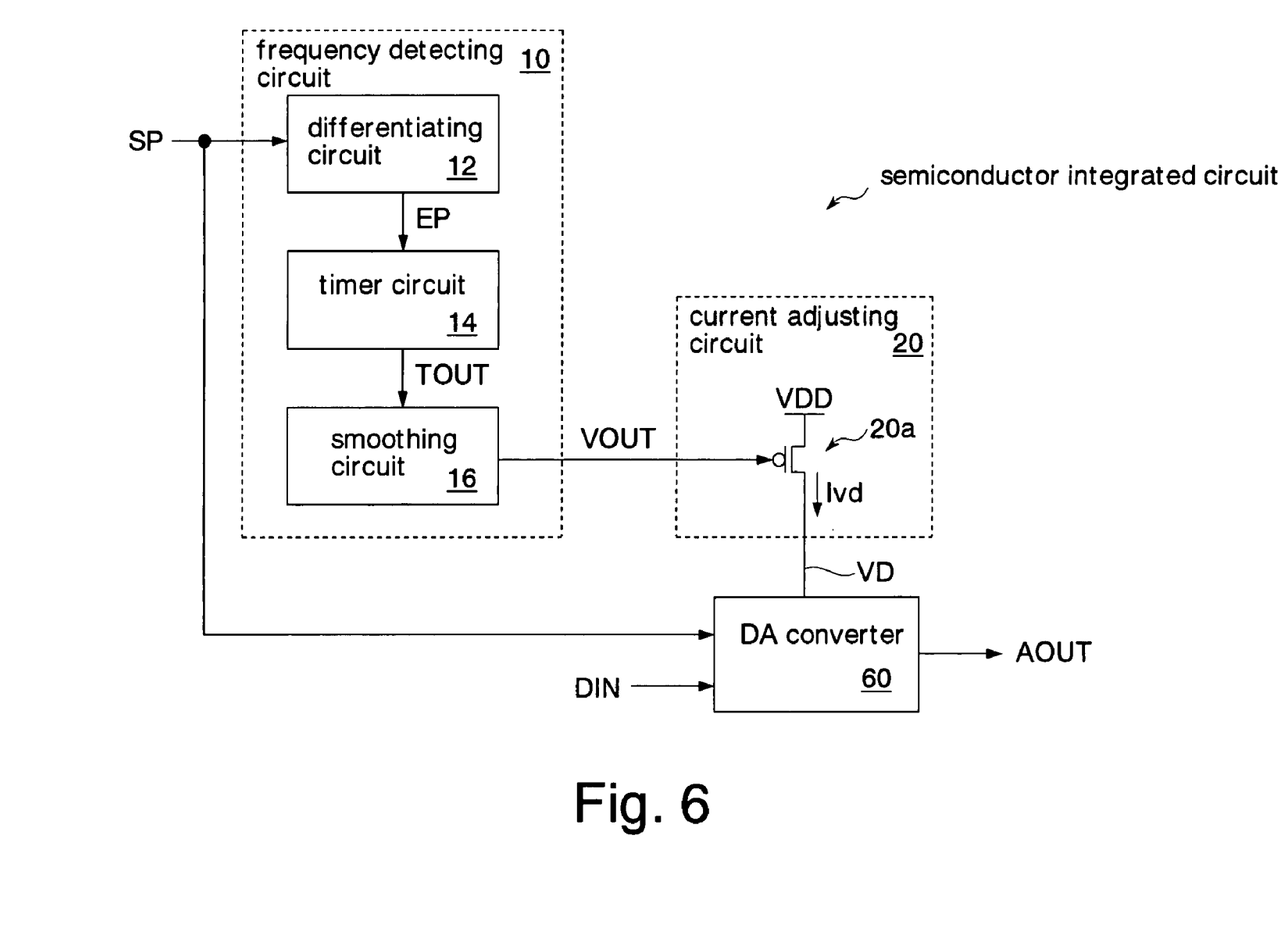
FIG. 6 is a block diagram showing a third embodiment of the semiconductor integrated circuit of the present invention.

FIG. 6 shows a third embodiment of the semiconductor integrated circuit of the present invention. The same elements as those described in the first embodiment will be designated by identical reference numbers or symbols. Detailed description thereof will be omitted. Like the first embodiment, this semiconductor integrated circuit is formed on a silicon substrate by using CMOS processes, as a system LSI to be mounted on a hand-held terminal such as a cellular phone. Aside from the components shown in the diagram, the semiconductor integrated circuit also contains a CPU core, an internal memory, an AD converter, a DSP, a timer, etc.

The semiconductor integrated circuit is provided with a DA converter 60 instead of the AD converter 30 of the first embodiment. The DA converter 60 converts a digital signal DIN received in synchronization with the sampling pulse SP into an analog signal AOUT for output. The rest of the configuration is the same as in the first embodiment. That is, the frequency detecting circuit 10 generates the detection voltage VOUT in accordance with the frequency of the sampling pulse SP. The current adjusting circuit 20 adjusts the power supply current Ivd to be supplied to the DA converter 60 in accordance with the detection voltage VOUT.

The DA converter 60 in use is of resistor-row type or current-driven type. The DA converter of resistor-row type generates an analog voltage, for example, by switching the number of resistors (resistance) to be connected in series between the power supply line and the ground line in accordance with the digital value. The DA converter of current-drive type generates an analog voltage, for example, by selecting any one of currents output from a plurality of current sources in accordance with the digital value. In either type of DA converter, a constant current (leak current) must be passed between the power supply line and the ground line, consuming an unnecessary power supply current. Thus, when the frequency of the sampling pulse SP is low, the power supply current is decreased to achieve a significant reduction in power consumption.

This embodiment can provide the same effects as those of the first embodiment described above. Besides, in this embodiment, the power supply current Ivd flowing steadily through the DA converter 60 (current not contributing to the operation of DA conversion) can be reduced with a decrease in sampling frequency. As a result, an optimum power supply current Ivd can always be supplied in accordance with the operating frequency of the DA converter 60. That is, the power consumption of the DA converter 60 can be reduced.

It is possible to form a DA converter 60 having a wide frequency band. Consequently, with a semiconductor integrated circuit to be mounted on a cellular phone having a dual mode function capable of calls of, e.g., GSM system and W-CDMA system, it is possible to reduce the number of DA converters to be formed on the semiconductor integrated circuit. As a result, the semiconductor integrated circuit can be reduced in chip size and chip cost. Moreover, it is possible to meet various requirements specification of the DA converter. This can prevent losing business chances and allow reduction of design resources.

The foregoing embodiments have dealt with the cases where the present invention is applied to a system LSI having an AD converter or a DA converter. However, the present invention is not limited to such embodiments. For example, the present invention may be applied to AD converters and DA converters made of a single integrated circuit (IC). In this case, the power supply current can be automatically adjusted in accordance with the sampling frequency without forming special control terminals on the IC. That is, reduced power consumption can be achieved without modifying conventional terminal specifications.

The foregoing embodiments have dealt with the cases where the power supply current of the AD converter or DA converter implemented in the semiconductor integrated circuit is adjusted in accordance with the sampling frequency. However, the present invention is not limited to such embodiments. For example, a frequency detecting circuit 10 common to the AD converter and the DA converter implemented in the semiconductor integrated circuit may be formed so that the power supply currents of both the AD converter and DA converter are adjusted based on the single detection voltage VOUT.

The foregoing second embodiment has dealt with the case where the power supply currents of the differential amplifiers AMP in the AD converter 50 are adjusted in accordance with the sampling frequency. However, the present invention is not limited to such an embodiment. For example, the first and third embodiments may be applied to exercise adjustment to the power supply currents of at least either ones of the sub AD converters ADC and the sub DA converters DAC in the AD converter 50, aside from the adjustment to the power supply currents of the differential amplifiers AMP. In this case, the power consumption of the AD converter 50 can be reduced further.

The invention is not limited to the above embodiments and various modifications may be made without departing from the spirit and scope of the invention. Any improvement may be made in part or all of the components.

What is claimed is:

1. A semiconductor integrated circuit comprising:
    an AD converter for converting an analog signal received in synchronization with a sampling pulse into a digital signal;
    a frequency detecting circuit for detecting frequency of said sampling pulse, and outputting the detected frequency as a detection value; and
    a current adjusting circuit for adjusting a power supply current to be supplied to said AD converter in accordance with said detection value.

2. The semiconductor integrated circuit according to claim 1, wherein:
    said frequency detecting circuit outputs said detection value as a detection voltage; and
    said current adjusting circuit has a transistor for receiving said detection voltage at its gate, said transistor being arranged between a power supply terminal of said AD converter and a power supply line.

3. The semiconductor integrated circuit according to claim 2, wherein
    said frequency detecting circuit includes:
    a pulse generating circuit for generating an edge detection pulse in synchronization with either one of a rising edge and a falling edge of said sampling pulse;
    a timer circuit for starting to measure predetermined time in synchronization with said edge detection pulse, and outputting a rectangular pulse which maintains a low level during measuring and maintains a high level during non-measuring; and
    a smoothing circuit for smoothing a voltage of said rectangular pulse, and outputting the smoothed voltage as said detection voltage.

4. The semiconductor integrated circuit according to claim 1, wherein:
    said AD converter includes
    a plurality of cascaded AD conversion units for sequentially generating a plurality of bits of said digital signal in units of k bits of digital values, and
    an operational circuit for synthesizing said k bits of digital values generated sequentially into said plurality of bits of digital signal;
    each of said AD conversion units includes
    a holding unit for holding an analog value output from said AD conversion unit at the preceding stage or said analog signal in synchronization with said sampling pulse,
    a sub AD converter for converting said analog value or said analog signal held by said holding unit into k bits of digital value,
    a sub DA converter for converting said digital value converted by said sub AD converter into an analog value, a subtracter for subtracting said analog value converted by said sub DA converter from said analog value or said analog signal held by said holding unit, and a multiplier for multiplying an analog signal output from said subtracter by $2^k$, and supplying the multiplied value to said holding unit at the next stage; and said current adjusting circuit adjusts a plurality of types of bias voltages each of which is for adjusting a power supply current to be supplied to said each multiplier, in accordance with said detection value.

5. The semiconductor integrated circuit according to claim 4, wherein said current adjusting circuit includes:

a bias generating unit for generating said bias voltages; and a transistor for receiving said detection voltage at its gate, said transistor being arranged between a power supply line and a power supply terminal of said bias generating unit.

6. A semiconductor integrated circuit comprising:

a DA converter for converting a digital signal received in synchronization with a sampling pulse into an analog signal;

a frequency detecting circuit for detecting frequency of said sampling pulse, and outputting the detected frequency as a detection value; and a current adjusting circuit for adjusting a power supply current to be supplied to said DA converter in accordance with said detection value.

7. The semiconductor integrated circuit according to claim 6, wherein:

said frequency detecting circuit outputs said detection value as a detection voltage; and said current adjusting circuit has a transistor for receiving said detection voltage at its gate, said transistor being arranged between a power supply terminal of said DA converter and a power supply line.

8. The semiconductor integrated circuit according to claim 7, wherein said frequency detecting circuit includes:

a pulse generating circuit for generating an edge detection pulse in synchronization with either one of a rising edge and a falling edge of said sampling pulse;

a timer circuit for starting to measure predetermined time in synchronization with said edge detection pulse, and outputting a rectangular pulse which maintains a low level during measuring and maintains a high level during non-measuring; and a smoothing circuit for smoothing a voltage of said rectangular pulse, and outputting the smoothed voltage as said detection voltage.

* * * * *